United States Patent [19]

Morikawa et al.

[11] Patent Number: 4,941,582
[45] Date of Patent: Jul. 17, 1990

[54] HERMETICALLY SEALED CERAMIC PACKAGE

[75] Inventors: Asao Morikawa; Kazuo Kondo, both of Aichi, Japan

[73] Assignee: NGK Spark Plug Co., Ltd., Nagoya, Japan

[21] Appl. No.: 415,777

[22] Filed: Oct. 2, 1989

[30] Foreign Application Priority Data

Oct. 7, 1988 [JP] Japan ............................ 63-132232[U]

[51] Int. Cl.⁵ ............................................. B65D 6/32
[52] U.S. Cl. ................................. 220/2.1 R; 428/34.6
[58] Field of Search ................... 220/2.1 R; 428/34.6, 428/432, 433, 434

[56] References Cited

U.S. PATENT DOCUMENTS

| | | | |
|---|---|---|---|
| 3,900,153 | 8/1975 | Beerwerth et al. | 228/246 |
| 4,261,476 | 4/1981 | Burrage | 220/2.1 R |
| 4,350,744 | 9/1982 | Snitzer | 428/433 |
| 4,587,144 | 5/1986 | Kellerman | 428/34.6 |
| 4,599,277 | 7/1986 | Brownlow | 428/432 |
| 4,608,592 | 8/1986 | Miyamoto | 357/80 |
| 4,624,897 | 11/1986 | Ito | 428/432 |
| 4,634,638 | 1/1987 | Ainslie | 428/671 |
| 4,649,085 | 3/1987 | Landram | 428/434 |
| 4,716,082 | 11/1987 | Ahearn | 428/432 |
| 4,835,593 | 5/1989 | Arnold | 357/74 |

Primary Examiner—Stephen Marcus
Assistant Examiner—Stephen Castellano
Attorney, Agent, or Firm—Foley & Lardner, Schwartz, Jeffery, Schwaab, Mack, Blumenthal & Evans

[57] ABSTRACT

The invention relates to a hermetically sealed ceramic package for an electric or electronic device, the package using a low temperature fired ceramic or glass-ceramic as the material of the package base supporting the device. The hermetically sealing joint between the package base and a ceramic cap is provided by metallizing the opposite surfaces of the base and the cap with Cu, plating the Cu metallized layer of each member with a metal not alloyable with Cu or Ag, such as Ni or Pd for example, plating that metal layer with Au and brazing the Au layer of the cap to the Au layer of the base with Au-Sn eutectic alloy. Since the Au layers are respectively shielded from the Cu metallized layers by the non-alloyable metal layers, the brazing operation to form the sealing layer of Au-Sn is accomplished without suffering from deterioration of the Au-Sn seal by intrusion of melted Cu into the Au-Sn seal.

10 Claims, 1 Drawing Sheet

HERMETICALLY SEALED CERAMIC PACKAGE

BACKGROUND OF THE INVENTION

This invention relates to a hermetically sealed ceramic package for electronic devices. A ceramic package according to the invention is particularly suitable for packaging devices operating at high frequencies such as microwave devices, devices high in withstand voltage and devices required of very high reliability.

Alumina is prevailing as the ceramic material of conventional ceramic packages for electronic devices, and for hermetically sealing an alumina package it is usual to use a gold-tin eutectic alloy as brazing solder to braze the cap or lid of the package to the header or base. Au-Sn solder is employed because the sealing solder needs to have a higher melting point than the soft solder such as Sn-Pb solder used in the subsequent operation of connecting the leads extruding from the package to a circuit board or the like.

However, in the case of a ceramic package using a base which is copper-metallized on the top surface, the sealing of the package by Au-Sn brazing solder encounters a problem that the seal becomes insufficient by reason of alloying of Cu on the metallized surface with the Au-Sn solder. Therefore, in conventional ceramic packages formed of a low temperature fired ceramic which is lower than alumina in dielectric constant and also in thermal expansion coefficient and metallized with copper, an ordinary soft solder must be used for sealing, and the applications of such packages are limited because of the possibility of melting of the soft solder seal during the subsequent manufacturing operations on the packaged devices.

SUMMARY OF THE INVENTION

It is an object of the present invention to provide a hermetically sealed ceramic package, which uses a low temperature fired ceramic, has a stable seal structure and is applicable to wide uses similarly to an alumina package.

According to the present invention there is provided a hermetically sealed ceramic package, which comprises a base member supporting an electronic or electric device, the base member being formed of a low temperature fired ceramic, a cap member formed of a ceramic, and a hermetically sealing joint provided between an upper surface of the base member and a lower surface of the cap member, the sealing joint comprising a copper-metallized layer formed on the upper surface of the base member, a first intermediate layer which is laid on the metallized layer and is formed of a metal not alloyable with Cu or Au, a first gold layer laid on the intermediate layer, a copper-metallized layer formed on the lower surface of the cap member, a second intermediate layer which is laid on the copper-metallized layer on the cap member and is formed of a metal not alloyable with Cu or Au, a second gold layer laid on the second intermediate layer and a joint layer which is tightly interposed between the first and second gold layers and is formed of Au-Sn eutectic alloy.

In the present invention the term "ceramic" includes glass-ceramic, and the term "low temperature fired ceramic" refers to a ceramic or glass-ceramic which can be sintered at a temperature in the range from 800° to 1100° C.

In this invention the metal material of the copper-metallized layers is either practically pure Cu or a copper alloy containing at least 40 wt % of Cu.

This invention can be embodied in various types of ceramic packages, including chip carriers, flat packages and pin grid array type packages. In plan view of a package according to the invention the sealing joint is in the shape of a band surrounding a predetermined area, which may be of any shape and, for example, may be rectangular or diffrently polygonal or circular.

The principal feature of the invention is interposing a layer of a metal with which neither Cu nor Au forms alloy between the copper-metallized layer and the Au layer on both the base and the cap. A preferred example of the non-alloyable metal is Ni. By virtue of the existence of this metal layer on each of the base and the cap, the brazing operation to form the sealing joint layer of Au-Sn is accomplished without suffering from intrusion of Cu into the Au-Sn even though the brazing causes melting of the copper-metallized layers. That is, the sealing joint layer of Au-Sn is not adversely influenced by the copper-metallized layers and, hence, fully exhibits its favorable characteristics and has good durability.

Thus, this invention makes it practicable to use Au-Sn eutectic alloy as a brazing solder to seal a package formed of a low temperature fired ceramic and metallized with copper. Therefore, the subsequent soldering operations can surely be accomplished without fear of adversely affecting the sealing layer, and the chip mounting and packaging operations can be carried out in the same manners as in the case of using an alumina package, and hence ceramic packages according to the invention have wide uses. As mentioned herein-before, the merits of using a low temperature fired ceramic as the material of the package include having a relatively low dielectric constant and exhibiting a thermal expansion coefficient relatively low and close to that of silicon.

DESCRIPTION OF THE PREFERRED EMBODIMENTS

FIGS. 1 to 4 show a ceramic package as an embodiment of the invention. Essentially the ceramic package is made up of a header or base 10 and a cap or lid 20. The base 10 is formed of a ceramic or glass-ceramic fired at a relatively low temperature (not higher than 1100° C.). The lid 20 is not necessarily formed of such a low temperature fired ceramic or glass-ceramic and may be formed of a ceramic fired at a relatively high temperature.

In this embodiment the package base 10 is a square member formed with a square recess 12 in a central region for receiving a chip or a device to be packaged. Nearly in the center of the base 10 there is a through-hole 14 having a small diameter, e.g. about 1 mm, for sucking the air from the interior of the assembled package. The lid 20 is a square plate slightly larger in widths than the square recess 12 of the base 10.

Figure 2:
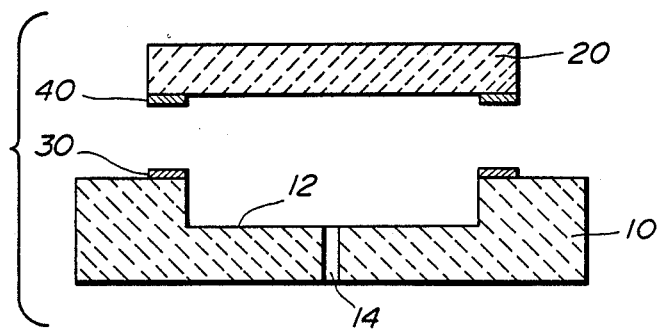
FIG. 2 is a vertical sectional view of the base and the lid of the same ceramic package before assembling.
Figure 3:
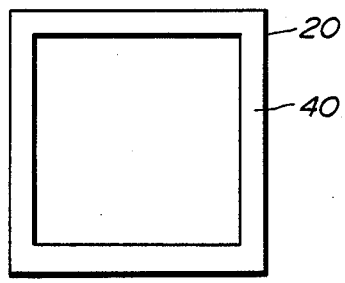
FIG. 3 is a plan view of the lid in FIG. 2 viewed from the inner side facing the base.
Figure 4:
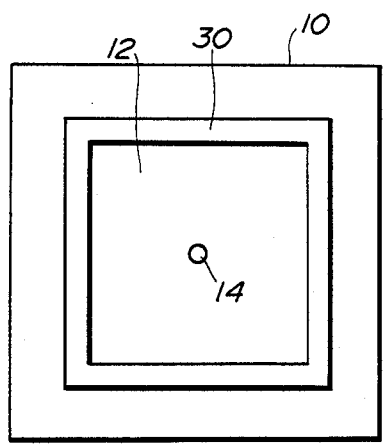
FIG. 4 is a plan view of the base in FIG. 2 viewed from the top side facing the lid.

On the top side facing the lid 20, the base 10 is provided with a metal layer 30 which is, as can be seen in FIGS. 2 and 4, in the form of a square band surrounding the periphery of the square recess 12. On the inner side facing the base 10, the lid 20 is provided with a metal layer 40 which is, as can be seen in FIGS. 2 and 3, in the form of a square band in conformance with the metal layer 30 on the base 10. Needless to mention, the square shape of the recess 12 of the base 10 and the corresponding shape of the metal layers 30, 40 are merely by way of example. According to the design of the package base, the metal layers 30 and 40 may be formed in any shape insofar as each metal layer 30, 40 surrounds a suitable area.

Figure 1:
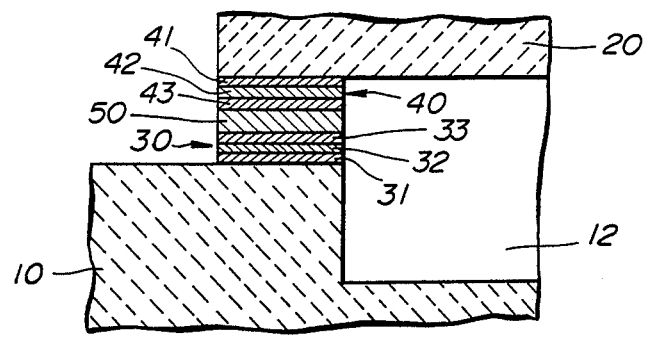
FIG. 1 is an explanatorily enlarged vertical sectional view of a hermetically sealed portion of a ceramic package embodying the present invention.

As shown in FIG. 1 the metal layer 30 on the base 10 is of a three-layer structure. That is, the metal layer 30 consists of a Cu metallized layer 31 formed directly on the ceramic surface of the base 10, an intermediate layer 32 of a metal which does not undergo alloying with copper or gold and an upper plating layer 33 of gold. The intermediate layer 32 will be referred to as the under plating layer. Similarly, the metal layer 40 on the lid 20 has a three-layer structure and consists of a Cu metallized layer 41 formed directly on the ceramic surface, an intermediate layer (under plating layer) 41 of a metal which does not undergo alloying with copper or gold and an upper plating layer 43 of gold.

The Cu metallized layers 31 and 41 are formed of either pure Cu or a copper alloy containing at least about 40 wt % of Cu. Usually each of the Cu metallized layers 31 and 41 has a thickness of about 10 μm. Each of the plating layers 32, 33, 42, 43 can be formed by either electrolytic plating or electroless plating. For example, the under plating layers 32, 42 are formed of nickel or palladium. Usually each of the plating layers 32, 33, 42, 43 has a thickness of about 2 μm.

As is usual, the package base 10 is provided with a conductor layer (not shown) such as a platinum layer on the top surface. Besides, at least one conductor layer (not shown) such as a copper or copper alloy layer about 10 μm in thickness is embedded in the base 10, and conductor pins (not shown) extend through the base 10 to connect the conductor layer on the surface and the embedded conductor layer(s) with each other. The conductor pins are provided by boring through-holes in the green body of the ceramic base 10 and tightly filling the through-holes with, for example, Cu or Cu-Pd alloy so as to airtightly close the holes.

In the completed ceramic package, as shown in FIG. 1, the lid 20 is hermetically bonded to the base 10 by a joint layer 50 which is formed of Au-Sn eutectic alloy used as a brazing solder. The Au-Sn joint layer 50 firmly adheres to both the gold surface 33 of the metal layer 30 on the base and the gold surface 43 of the metal layer 40 on the lid 20 and provides a hermetic seal between the base 10 and the lid 20. Usually the joint layer 50 has a thickness of about 50 μm. Since the joint layer 50 of Au-Sn and the adjacent Au layers 33, 43 are shielded from the Cu metallized layers 31, 41 by the intermediate layers 32, 42 of a suitable metal such as Ni, there is no possibility that the sealing effect of the Au-Sn layer 50 is degraded by alloying with Cu.

In the present invention it is preferable that the package base 10 and the lid 20 are formed of a glass-ceramic such as one using an aluminosilicate glass composition comprising $SiO_2$, $Al_2O_3$, MgO, ZnO and $B_2O_3$ as essential components. The ultimate firing of such a glass for precipitation of crystals can be accomplished at a temperature lower than 1100° C. and in some cases lower than 1000° C., and the obtained glass-ceramic has a dense structure and sufficiently high mechanical strength. Furthermore, the thermal expansion coefficient of the glass-ceramic is lower than that of alumina and is close to that of a silicon semiconductor chip, and the dielectric constant of the glass-ceramic is lower than that of alumina ($\epsilon = 9$).

EXAMPLE

Samples of the ceramic package shown in FIGS. 1-4 were produced by the following operations.

1. Preparation of Glass Compositions

As shown in the following table, five kinds of glass compositions were prepared by using ZnO, MgO, $Al_2O_3$, $SiO_2$ and $B_2O_3$ as essential raw materials and $P_2O_5$ and/or $ZrO_2$ as optional raw materials. In every case predetermined amounts of the raw materials in powder form were mixed in a mixer of a mortar type having eccentric pestles. The powder mixture was melted in a platinum of alumina ceramic crucible at a suitable temperature ranging from 1400° to 1500° C., and the melt was poured into water to obtain a vitrified and solidified glass. The glass was pulverized in a ball mill made of alumina ceramic to obtain a glass powder (frit) about 2-3 μm in particle size.

2. Preparation of Green Sheet

Polyvinyl butyral and a plasticizer (e.g. diethylene glycol) were added to each of the glass powders prepared by the above steps, and the resultant wet mixture was formed into a green sheet having a thickness of about 0.6 mm by the doctor blade method.

Samples of each green sheet were fired to turn into a glass-ceramic. The firing was accomplished by the steps of heating the green sheet up to 950° C. at a rate of 100° C./hr, maintaining the temperature of 950° C. for 2 hr, and then cooling the fired sheet at a rate of 200° C./hr. The obtained glass-ceramic samples were subjected to measurement of moisture absorption, dielectric constant, dielectric loss tangent, thermal expansion coefficient and mechanical break strength.

The results are shown in the table.

|  | Glass-ceramics | | | | |
| --- | --- | --- | --- | --- | --- |
|  | No. 1 | No. 2 | No. 3 | No. 4 | No. 5 |
| Raw Materials (wt %) | | | | | |
| ZnO | 2.5 | 3.0 | 3.0 | 3.5 | 4.0 |
| MgO | 12.0 | 14.5 | 14.5 | 15.0 | 13.0 |
| $Al_2O_3$ | 25.5 | 24.5 | 24.0 | 23.5 | 23.0 |
| $SiO_2$ | 57.5 | 56.0 | 55.0 | 56.0 | 58.0 |
| $B_2O_3$ | 2.0 | 1.5 | 2.0 | 1.0 | 1.0 |
| $P_2O_5$ | 0.5 | — | 1.0 | 1.0 | 1.0 |
| $ZrO_2$ | — | 0.5 | 1.0 | — | — |
| Characteristics | | | | | |
| Moisture Absorption (%) | 0 | 0 | 0 | 0 | 0 |
| Dielectric Constant (10 MHz) | 5.2 | 5.5 | 5.3 | 5.5 | 5.5 |
| tan δ ($\times 10^{-4}$) (1-10 MHz) | 10 | 10 | 10 | 10 | 10 |
| Thermal Expansion Coefficient ($\times 10^{-7}$) (room temp. ~ 400° C.) | 25 | 27 | 26 | 30 | 27 |
| Break Strength (kg/cm$^2$) | 2200 | 2600 | 2300 | 2300 | 2400 |

3. Production of Package Base and Lid

Three green sheets of the same composition were used to form a green body of the backage base 10. Each green sheet was punched to bore through-holes at predetermined locations, and the through-holes were tightly filled with Cu or Cu-Pd (80/20 by weight). On one green sheet to be used as the top layer of the green body of the base 10, platinum paste layer was formed in a predetermined pattern by screen-printing. The platinum paste layer was to turn into an electrode layer by the subsequent firing operation. On the same green sheet, a copper paste layer was formed in the pattern of the square band shown in FIG. 4 by screen printing. The copper paste was applied also to the other two green sheets to form precursors of conductor layers embedded in the ceramic base 10. The copper paste was composed of, by weight, 70 parts of CuO powder (mean particle size 1.5 $\mu$m), 5 parts of Cu powder (mean particle size 0.8 $\mu$m), 10 parts of Cu powder (mean particle size 3.2 $\mu$m), 15 parts of Cu powder (mean particle size 15 $\mu$m), 7 parts of $MnO_2$ powder (mean particle size 3 $\mu$m), 4 parts of $TiO_2$ powder (mean particle size 1.5 $\mu$m), 5 parts of a binding resin and an adequate amount of solvent for the resin.

After that, the three green sheets were placed one upon another in the predetermined order, and the resultant laminate was rendered a unitary green plate by application of heat and pressure. Then the green plate was cut into pieces of a predetermined shape, and each piece was worked and finished to accurately form a green body of the base 10. The green body was calcined in the air at about 300° C. for about 5 hr to decompose and dissipate the organic matter contained in the green body itself and the aforementioned paste layers. After that the green body was further heated in the air at 600°–750° C. for about 1 hr to remove residual carbon. Next, the green body was heated in an ammonia decomposition gas at 350°–750° C. for reducing CuO containing in the copper paste to Cu. Finally the green body was fired in a neutral atmosphere at 900°–1100° C. for about 1 hr to unitarily sinter the glass-ceramic and the Cu metallized layers. The thus produced base 10 had the Cu metallized layer 31 on the top surface. By the same process the lid 20 having the Cu metallized layer 41 was produced.

Next, nickel was plated on the Cu metallized layer 31 of the base 10 and also on the Cu metallized layer 41 and 42, and then gold was plated on the Ni layer 32 and 42 to form the outer plating layers 33 and 43.

4. Assembly of the Ceramic Package

The lid 20 was bonded to the base 10 by using Au-Sn eutectic alloy as a brazing solder to form the hermetic joint layer 50 to thereby complete the hermetic ceramic package. The brazing and bounding operation to form the hermetic joint layer 50 of Au-Sn was performed in decomposition gas atmosphere or nitrogen gas atmosphere at a temperature of 350° C.

5. Testing of the Ceramic Package Samples

The hermeticity of each sample of the ceramic package was examined by sucking the air from the package through the hole 14, then injecting helium gas into the package and measuring the rate of leaking of helium gas by the standard helium leak detector method. On every sample leaking of helium gas was measured to be less than $3 \times 10^{-8}$ cc (N.T.P.)/sec, and accordingly every sample was judged to be sufficient in hermeticity.

Next, the samples of the ceramic package were subjected to a thermal shock test consisting of 15 cycles of heating to 100° C. and cooling to 0° C., subsequent 15 cycles of heating to 125° C. and cooling to −55° C. and subsequent 100 cycles of heating to 150° C. and cooling to −65° C. After the thermal shock test the hermeticity of each sample was examined by the aforementioned method. As the result, no sample exhibited significant deterioration in hermeticity.

What is claimed is:

1. A hermetically sealed ceramic package for an electric or electronic device, comprising:
    a base member to support said device, the base member being formed of a low temperature fired ceramic;
    a cap member formed of a ceramic; and
    a hermetically sealing joint provided between an upper surface of the base member and a lower surface of the cap member, the sealing joint comprising a copper-metallized layer formed on said upper surface of the base member, a first intermediate layer which is laid on said copper-metallized layer and is formed of a metal not alloyable with copper or gold, a first gold layer laid on said first intermediate layer, a copper-metallized layer formed on said lower surface of the cap member, a second intermediate layer which is laid on the copper-metallized layer on the said lower surface and is formed of a metal not alloyable with copper or gold, a second gold layer laid on said second intermediate layer and a joint layer which is tightly interposed between said first and second gold layers and is formed of a gold-tin eutectic alloy.

2. A ceramic package according to claim 1, wherein said low temperature fired ceramic is a glass-ceramic.

3. A ceramic package according to claim 2, wherein said glass-ceramic comprises an aluminosilicate glass matrix.

4. A ceramic package according to claim 1, wherein said cap member is formed of said low temperature fired ceramic.

5. A ceramic package according to claim 4, wherein said low temperature fired ceramic is a glass-ceramic.

6. A ceramic package according to claim 1, wherein said first and second intermediate layers are formed of nickel.

7. A ceramic package according to claim 1, wherein said first and second intermediate layers are formed of palladium.

8. A ceramic package according to claim 1, wherein the copper-metallized layers are formed of Cu.

9. A ceramic package according to claim 1, wherein the copper-metallized layers are formed of a copper alloy containing at least 40 wt % of Cu.

10. A ceramic package according to claim 1, wherein said sealing joint is in the shape of a band surrounding a predetermined area.

* * * * *